(12) United States Patent
Chuang et al.

(10) Patent No.: US 12,422,471 B2
(45) Date of Patent: Sep. 23, 2025

(54) MULTIPHASE THERMAL INTERFACE COMPONENT, METHOD OF FORMING THE SAME AND ELECTRONIC DEVICE TESTING APPARATUS PROVIDED WITH THE SAME

(71) Applicant: CHROMA ATE INC., Taoyuan (TW)

(72) Inventors: Yu-Wei Chuang, Taoyuan (TW); Xin-Yi Wu, Taoyuan (TW); Jui-Che Chou, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 161 days.

(21) Appl. No.: 18/511,638

(22) Filed: Nov. 16, 2023

(65) Prior Publication Data
US 2024/0192268 A1 Jun. 13, 2024

(30) Foreign Application Priority Data
Dec. 13, 2022 (TW) ................... 111147729

(51) Int. Cl.
*G01R 31/28* (2006.01)
*G05D 23/20* (2006.01)
*H01L 21/66* (2006.01)

(52) U.S. Cl.
CPC ..... *G01R 31/2874* (2013.01); *G01R 31/2863* (2013.01); *G05D 23/20* (2013.01); *H01L 22/12* (2013.01)

(58) Field of Classification Search
CPC ............ G01R 31/2874; G01R 31/2875; G01R 31/2877
See application file for complete search history.

(56) References Cited

U.S. PATENT DOCUMENTS

2004/0051545 A1* 3/2004 Tilton ................ G05D 23/1919
324/750.08
2005/0067143 A1 3/2005 Huang et al.
(Continued)

FOREIGN PATENT DOCUMENTS

CN 115023118 A 9/2022
TW 200814485 A 5/2006
(Continued)

*Primary Examiner* — Tung X Nguyen
(74) *Attorney, Agent, or Firm* — Birch, Stewart, Kolasch & Birch, LLP

(57) ABSTRACT

A multiphase thermal interface component, a method of forming the same, and an electronic device testing apparatus provided with the same are provided. The multiphase thermal interface component includes a thermal interface solid element and a thermal interface fluid material. The thermal conductive surface of the thermal interface solid element has an accommodation space, and the thermal interface fluid material is accommodated in the accommodation space. Therefore, the multiphase thermal interface component combines solid-phase and fluid-phase thermal interface materials. Since fluids have the properties of changing shape, flowing, and splitting arbitrarily, the thermal interface fluid material can completely fill up the air gaps between the thermal interface solid element and the thermal control device/the temperature-controlled component, so that the full surface temperature control of the contact interface can be achieved, thereby effectively improving the thermal conduction performance.

10 Claims, 6 Drawing Sheets

(56) References Cited

U.S. PATENT DOCUMENTS

| | | |
|---|---|---|
| 2008/0116921 A1 | 5/2008 | Cote et al. |
| 2014/0062513 A1 | 3/2014 | Johnson et al. |
| 2014/0084953 A1* | 3/2014 | Diglio ................ G01R 31/2875 |
| | | 165/185 |
| 2015/0289850 A1 | 10/2015 | Lewis et al. |
| 2017/0027084 A1 | 1/2017 | Kabbani et al. |
| 2021/0134698 A1 | 5/2021 | Arrington et al. |

FOREIGN PATENT DOCUMENTS

| | | |
|---|---|---|
| TW | 200838958 A | 10/2006 |
| TW | 200921872 A | 5/2009 |

* cited by examiner

MULTIPHASE THERMAL INTERFACE COMPONENT, METHOD OF FORMING THE SAME AND ELECTRONIC DEVICE TESTING APPARATUS PROVIDED WITH THE SAME

CROSS-REFERENCE TO RELATED APPLICATION

This non-provisional application claims priority under 35 U.S.C. § 119(a) to Patent Application No. 111147729 filed in Taiwan, R.O.C. on Dec. 13, 2022, the entire contents of which are hereby incorporated by reference.

BACKGROUND

Technical Field

The instant disclosure is related to a multiphase thermal interface component, a method of forming the same, and an electronic device testing apparatus provided with the same, especially to a thermal conductive component combined with at least two thermal interface materials having different phases. The thermal conductive component can be utilized in heat dissipation applications for electronic devices or other temperature control applications.

Related Art

A thermal interface material (TIM) is provided between a thermal control device and a temperature-controlled component so as to reduce the contact thermal resistance between the thermal control device and the temperature-controlled component.

SUMMARY

The main reason for employing the thermal interface material is described as below. For an object, as long as the object is solid, the surface of the object inherently has a roughness; and for a thin object (such as a chip), warpage may occur. As a result, when the thermal control device contacts the temperature-controlled component in a surface-contact manner, it is very difficult for the surface of the thermal control device and the surface of the temperature-controlled component to be in complete alignment, and some air gaps may be present between the surfaces. As the thermal conductivity of air is very low, only 0.026 W/m·K, the air gaps thus cause a very high contact thermal resistance.

However, for the chip testing fields, when an air gap is present between the chip and the thermal control device, the region of the chip corresponding to the air gap will experience elevated temperature, thus possibly affecting the testing results or even burning out the chip. Therefore, as known to the inventor, a thermal interface material is provided between the thermal control device and the temperature-controlled component to fill up the air gaps, so that the contact thermal resistance can be reduced thereby improving thermal control performance.

Furthermore, a thermal interface material known to the inventor is in solid state, for instance, the solid-state thermal interface material may be an indium alloy sheet which has high thermal conductivity and ductility. The surface of the indium alloy sheet is provided with certain textures (such as protrusions or grid patterns). When the indium alloy sheet is subjected to a compressive force, the indium alloy sheet can deform elastically to fill up the air gap between the thermal control device and the temperature-controlled component. On the other hand, to accommodate large air gaps caused by the surface roughness or component warpage, the height differences between higher portions and lower portions of the certain textures are designed to be larger. Therefore, the compressibility of the indium alloy sheet can be increased to ensure that the indium alloy sheet can contact the surface of the thermal control device or the surface of the temperature-controlled component more sufficiently. However, the larger the height differences between the higher portions and the lower portions of the certain textures are, the easier the more or larger air gaps are present.

Moreover, as known to the inventor, liquid-state thermal interface materials have also been used. For example, US patent publication number US 2017027084 A1, titled with "Continuous Fluidic Thermal Interface Material Dispensing", discloses that a dispenser is used to apply the fluidic thermal interface material to a contact surface between a thermal head and an electronic device. However, for the patent publication, it is hard to ensure all the air gaps between the thermal head and the electronic device are completely filled with the liquid-state thermal interface material. Especially, in the case that the electronic device is deformed and thus the component warpages (in which some portions of the component protrude outward), it becomes difficult for the liquid-state thermal interface material to be retained in place between the thermal head and the electronic device. Furthermore, regardless the formulation of the liquid-state thermal interface material, the thermal conductivity of the liquid-state thermal interface material is inferior to that of the solid-state thermal interface material (such as the indium alloy sheet); besides, the liquid-state thermal interface material may cause the contamination or short circuit in the electronic device.

SUMMARY

One of objects of one or some embodiments of the instant disclosure is to provide a multiphase thermal interface component, a method of forming the same, and an electronic device testing apparatus provided with the same. Therefore, the contact surface between the thermal control device and the temperature-controlled component can perform the thermal conduction completely, thereby effectively improving the thermal conduction performance.

To achieve the object, one or some embodiments provide a method of forming a multiphase thermal interface component, and the method comprises following steps: providing a thermal interface solid element, wherein the thermal interface solid element has a first thermal conductive surface and a second thermal conductive surface, and at least one surface among the first thermal conductive surface and the second thermal conductive surface has at least one accommodation space; the first thermal conductive surface is configured to contact a thermal control device, and the second thermal conductive surface is configured to contact a temperature-controlled component; and applying a thermal interface fluid material to at least one among on the thermal interface solid element, between the thermal control device and the first thermal conductive surface, and between the second thermal conductive surface and the temperature-controlled component, and filling the thermal interface in the at least one accommodation space: the thermal interface fluid material under ambient temperature is in a liquid state, a gas state, a gel state, or a combination of any two or three thereof.

Accordingly, in the method of forming a multiphase thermal interface component according one or some embodiments of the instant disclosure, the thermal interface fluid material is applied to at least one among on the thermal interface solid element, between the thermal control device and the first thermal conductive surface, and between the second thermal conductive surface and the temperature-controlled component. Therefore, the air gap at the contact interface between the thermal interface solid element and the thermal control device (or the temperature-controlled component) can be filled up by the thermal interface fluid material, thereby eliminating the uneven thermal conduction caused by the air gaps and thus apparently reducing the contact thermal resistance.

To achieve the object, one or some embodiments of the instant disclosure provide a multiphase thermal interface component comprising a thermal interface solid element and a thermal interface fluid material. The thermal interface solid element has a first thermal conductive surface and a second thermal conductive surface, and at least one surface among the first thermal conductive surface and the second thermal conductive surface has at least one accommodation space. The thermal interface fluid material is filled into the at least one accommodation space of the at least one surface. The thermal interface solid element under ambient temperature is in a solid state. The thermal interface fluid material under ambient temperature is in liquid, gas, or gel state, or a combination of any two or three thereof.

Furthermore, one or some embodiments of the instant disclosure provide a multiphase thermal interface component which combines solid-phase and fluid-phase thermal interface materials (TIM). The thermal interface fluid material under ambient temperature can be in liquid, gas, or gel state, or a combination of any two or three thereof. Since fluids have the properties of changing shape, flowing, and splitting arbitrarily, the thermal interface fluid material can completely fill up the air gaps in the contact interface between the thermal interface solid element and the thermal control device (or the temperature-controlled component), so that the full surface temperature control of the contact interface can be achieved, thereby effectively improving the thermal conduction performance.

To achieve the object, one or some embodiments of the instant disclosure provide an electronic device testing apparatus with multiphase thermal interface component. The electronic device testing apparatus comprises a thermal control device, a multiphase thermal interface component, and a socket. The multiphase thermal interface component comprises a thermal interface solid element and a thermal interface fluid material. The thermal interface solid element has a first thermal conductive surface and a second thermal conductive surface. At least one surface among the first thermal conductive surface and the second thermal conductive surface has at least one accommodation space. The thermal interface fluid material is filled into the at least one accommodation space of the at least one surface. The socket is configured to accommodate an electronic device under test. The first thermal conductive surface of the thermal interface solid element is configured to contact the thermal control device, and the second thermal conductive surface of the thermal interface solid element is configured to contact the electronic device under test.

In other words, in the electronic device testing apparatus with multiphase thermal interface component according to one or some embodiments of the instant disclosure, the multiphase thermal interface component can be served as a thermal conduction element between the thermal control device and the electronic device under test (the temperature-controlled component). Furthermore, the thermal interface fluid material is provided to fill up the air gaps of the thermal interface solid element, the air gaps between the thermal interface solid element and the thermal control device, and/or the air gaps between the thermal interface solid element and the electronic device under test. This completely eliminates the problem of localized ineffective thermal control due to air gaps, and the full surface temperature control of all the thermal contact interfaces can be achieved, thereby apparently improving the thermal conduction performance and efficiency.

BRIEF DESCRIPTION OF THE DRAWINGS

The disclosure will become more fully understood from the detailed description given herein below for illustration only, and thus not limitative of the disclosure, wherein.

DETAILED DESCRIPTION

Prior to the description of a multiphase thermal interface component, method of forming the same, and electronic device testing apparatus provided with the same according to one or some embodiments is provided, it is understood that in the following descriptions, similar elements are denoted by identical reference numbers. Moreover, the figures in the instant disclosure are provided merely for illustrative purposes and may not necessarily be drawn to scale, and not all the details of the instant disclosure may be shown in the figures.

Figure 1A:
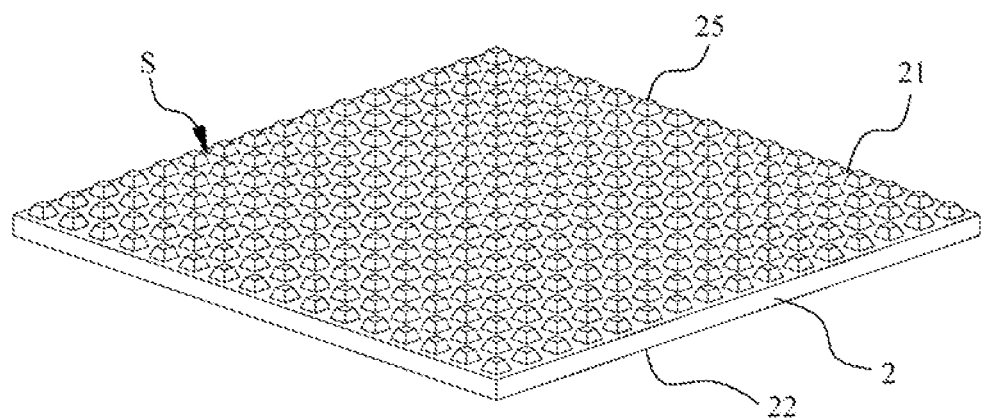
FIG. 1A illustrates a perspective view of a thermal interface solid element of a multiphase thermal interface component according to an exemplary embodiment of the instant disclosure.
Figure 1B:
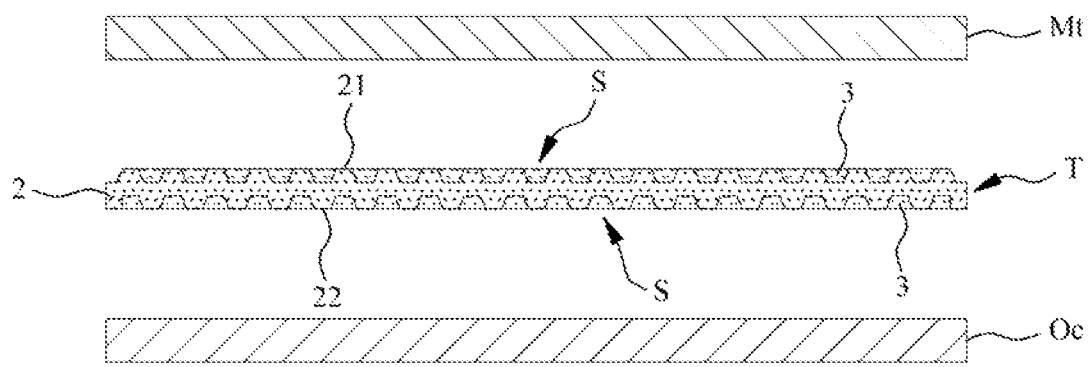
FIG. 1B illustrates a cross-sectional view of a multiphase thermal interface component according to an exemplary embodiment of the instant disclosure.

Please refer to FIG. 1A and FIG. 1B. FIG. 1A illustrates a perspective view of a thermal interface solid element of a multiphase thermal interface component according to an exemplary embodiment of the instant disclosure, and FIG. 1B illustrates a cross-sectional view of a multiphase thermal interface component according to an exemplary embodiment of the instant disclosure. As shown in the figures, in this embodiment, a multiphase thermal interface component T comprises a thermal interface solid element 2 and a thermal interface fluid material 3. The thermal interface solid element 2 has a first thermal conductive surface 21 and a second thermal conductive surface 22. The first thermal conductive surface 21 is configured to contact a thermal control device Mt (for example, a heat dissipation unit, a cooler, or a heater). The second thermal conductive surface 22 is configured to contact a temperature-controlled component Oc (for example, a central processing unit (CPU) or a graphic processing unit (GPU)).

In this embodiment, the thermal interface solid element 2 adopts an indium-based alloy sheet. The indium-based alloy sheet belongs to a phase-change metallic sheet and has great thermal conductivity and ductility, and the thermal conductivity of the indium-based alloy sheet is in a range between 50 and 80 W/m·K. The thermal interface solid element 2 under ambient temperature is in a solid state. Moreover, both the first thermal conductive surface 21 and the second thermal conductive surface 22 of the thermal interface solid element 2 are provided with a plurality of protrusions 25. The protrusions 25 are provided to increase the compressibility of the thermal interface solid element 2 so as to ensure better contact between the thermal interface solid element 2 and the surface of the thermal control device Mt (or the temperature-controlled component Oc). Furthermore, the protrusions 25 of the first thermal conductive surface 21 and the protrusions 25 of the second thermal conductive surface 22 form an accommodation space S on the first thermal conductive surface 21 and the second thermal conductive surface 22, respectively, and the thermal interface fluid material 3 is accommodated within the accommodation spaces S.

Moreover, the thermal interface fluid material 3 under ambient temperature is in liquid, gas, or gel state, or a combination of any two or three thereof. The thermal interface fluid material 3 is flowable and deformable, so that the thermal interface fluid material 3 is allowed to be filled into an accommodation space S of arbitrary shape. The thermal interface fluid material 3 in liquid-state may include water, ethylene glycol solution, deionized water, electronics cooling liquids (such as 3M™ Fluorinert™), nanomaterial fluids, or the like. The nanomaterial fluids may be formed by nanoparticles and a base liquid. The nanoparticles may be metals, metal oxides, carbides, carbon nanotubes (CNT), or graphene. In one embodiment, the nanoparticles are magnesium. The base liquid may be water, ethylene glycol, or oil. In one embodiment, the oil is synthetic thermal conductive oil (such as Therminol™). Moreover, the thermal interface fluid material 3 in gas-state may be helium gas, hydrogen gas, argon gas, other gases with thermal conductivity superior to that of air, or the gas vaporized from the thermal interface fluid material 3 in liquid-state. The thermal interface fluid material 3 in gel-state may be a thermal conductive glue or a thermal conductive paste.

Moreover, in this embodiment, both the first thermal conductive surface 21 and the second thermal conductive surface 22 of the thermal interface solid element 2 are provided with the thermal interface fluid material 3, but the instant disclosure is not limited thereto. In other embodiments, the thermal interface fluid material 3 may be only provided on the first thermal conductive surface 21 or the second thermal conductive surface 22. Moreover, the thermal interface solid element 2 may be made of a porous material, such as a carbon nanotube sheet or a graphite film, while the thermal interface fluid material 3 can completely fill into all the pores of the thermal interface solid element 2.

Figure 1C:
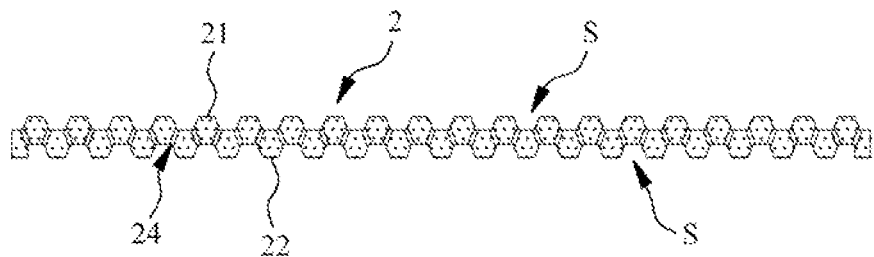
FIG. 1C illustrates a cross-sectional view of a multiphase thermal interface component according to another exemplary embodiment of the instant disclosure.

Please refer to FIG. 1C. FIG. 1C illustrates a cross-sectional view of a multiphase thermal interface component according to another exemplary embodiment of the instant disclosure. In this embodiment, the thermal interface solid element 2 comprises a plurality of through holes 24 defined through the first thermal conductive surface 21 and the second thermal conductive surface 22. Therefore, according to some embodiments, by applying the thermal interface fluid material 3 on one side of the thermal interface solid element 2, the thermal interface fluid material 3 can flow between the first thermal conductive surface 21 and the second thermal conductive surface 22 through the through holes 24. Therefore, the accommodation space S of the first thermal conductive surface 21 and the accommodation space S of the second thermal conductive surface 22 are filled with the thermal interface fluid material 3. Hence, according to one or some embodiments, the object that all the contact surfaces of the thermal interface solid element 2 are free of air gaps can be achieved.

Figure 2A:
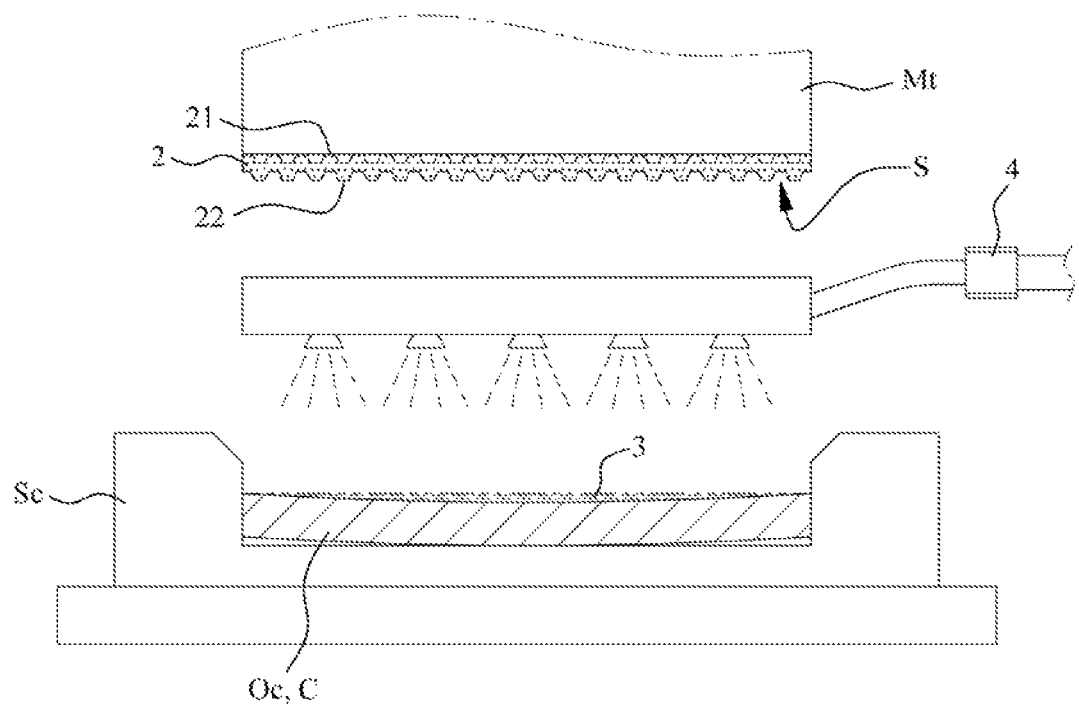
FIG. 2A illustrates a cross-sectional view of an electronic device testing apparatus with multiphase thermal interface component according to a first embodiment of the instant disclosure, showing that a thermal interface fluid material is applying.
Figure 2B:
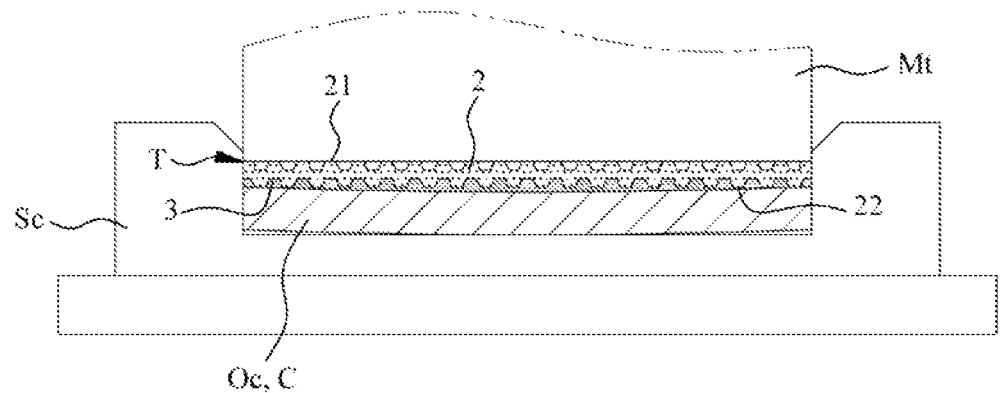
FIG. 2B illustrates a cross-sectional view of the electronic device testing apparatus with multiphase thermal interface component of the first embodiment of the instant disclosure, showing that the multiphase thermal interface component contacts an electronic device under test.

Please refer to FIG. 2A and FIG. 2B. FIG. 2A illustrates a cross-sectional view of an electronic device testing apparatus with multiphase thermal interface component according to a first embodiment of the instant disclosure, showing that a thermal interface fluid material is applying, and FIG. 2B illustrates a cross-sectional view of the electronic device testing apparatus with multiphase thermal interface component of the first embodiment of the instant disclosure, showing that the multiphase thermal interface component contacts an electronic device under test. In this embodiment, an electronic device testing apparatus comprises a thermal control device Mt, a multiphase thermal interface component T, a socket Sc, and a fluid application device 4. The thermal control device Mt may be a press head provided with a heater, a cooler, or a heat dissipation unit, and the multiphase thermal interface component T may be an implementation described above, wherein the first thermal conductive surface 21 of the multiphase thermal interface component T is connected to the lower surface of the thermal control device Mt. The socket Sc is configured to accommodate an electronic device under test C (the temperature-controlled component Oc).

Moreover, in this embodiment, the fluid application device 4 is a spray device. Before the testing procedure, when the electronic device under test C is placed in the socket Sc, the fluid application device 4 is moved to a portion above the electronic device under test C and begins to apply the thermal interface fluid material 3. When the application of the thermal interface fluid material 3 reaches to a certain amount, the fluid application device 4 is removed away from the portion above the electronic device under test C. Subsequently, the thermal control device Mt is moved downward, so that the second thermal conductive surface 22 of the multiphase thermal interface component T contacts the electronic device under test C on the socket Sc, and thus the thermal interface fluid material 3 is filled into the accommodation space S on the second thermal conductive surface 22, as shown in FIG. 2B.

Figure 2C:
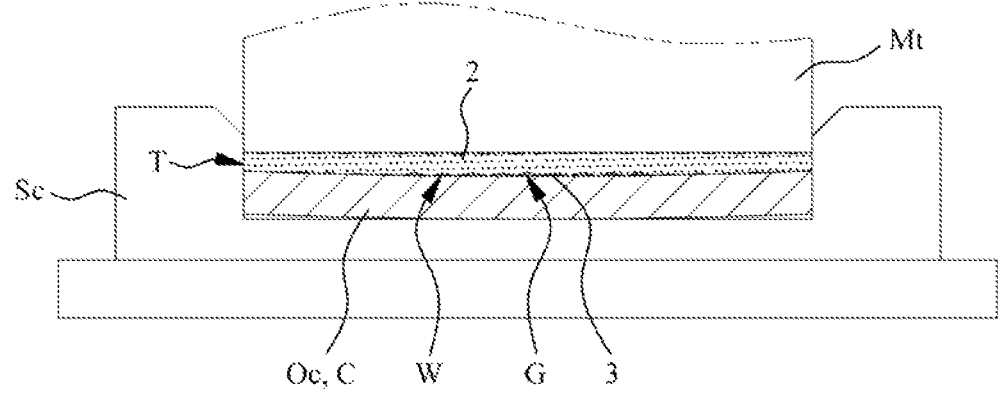
FIG. 2C illustrates a cross-sectional view of the electronic device testing apparatus with multiphase thermal interface component of the first embodiment of the instant disclosure, showing that the electronic device under test is testing.

Please refer to FIG. 2C. FIG. 2C illustrates a cross-sectional view of the electronic device testing apparatus with multiphase thermal interface component of the first embodiment of the instant disclosure, showing that the electronic device under test is testing. As shown in the figure, in order to ensure that the thermal control device Mt, the multiphase thermal interface component T, and the temperature-controlled component C can be fully contacted, the thermal control device Mt applies a downward pressure to the multiphase thermal interface component T and the electronic device under test C. Under this condition, the multiphase thermal interface component T is deformed when subjected to compression. It is understood that, to highlight the advantages according to one or some embodiments of the instant disclosure, the electronic device under test C is deliberately shown as having noticeable warpage in the figure. Therefore, in the warpage portion W, noticeable gaps G still present between the multiphase thermal interface component T and the upper surface of the electronic device under test C, and these gaps G will then be filled with the thermal interface fluid material 3. Accordingly, according to one or some embodiments of the instant disclosure, all air gaps can be completely eliminated, thereby improving the thermal conduction performance.

Moreover, according to the configuration of one or some embodiments of the instant disclosure, water and electronics cooling liquid (such as 3M™ Fluorinert™ electronics fluorinated liquid FC-3283) are served as the thermal interface fluid material 3. The following simulation data is provided to demonstrate that the multiphase thermal interface component, the method of forming the same, and the electronic device testing apparatus provided with the same according to one or some embodiments of the instant disclosure indeed have apparent effectiveness. The thermal interface solid element 2 adopts the indium alloy sheet with a thermal conductivity of 67 W/m·K: while the thermal conductivity of water is 0.613 W/m·K, and the thermal conductivity of the electronics cooling liquid is 0.066 W/m·K. According to the computer simulation result, in the case that the electronic device under test C has a 0.01 mm warpage, when only a solid-state thermal interface material (TIM) known to the inventor is used, apparent air gaps present between the solid-state thermal interface material and the electronic device under test C, and the temperature of the electronic device under test C is 119.76° C. On the other hand, when the configuration of the foregoing embodiment is applied and the electronics cooling liquid is served as the thermal interface liquid material 3, the temperature of the electronic device under test C is 98.9° C. Likewise, when the configuration of the foregoing embodiment is applied and water is served as the thermal interface liquid material 3, the temperature of the electronic device under test C is reduced to 73.76° C. Therefore, when the multiphase thermal interface component T according to one or some embodiments of the instant disclosure is provided for cooling purpose, the thermal dissipation efficiency can be apparently enhanced, thereby greatly reducing the temperature of the temperature-controlled component Oc (the electronic device under test C).

Figure 3:
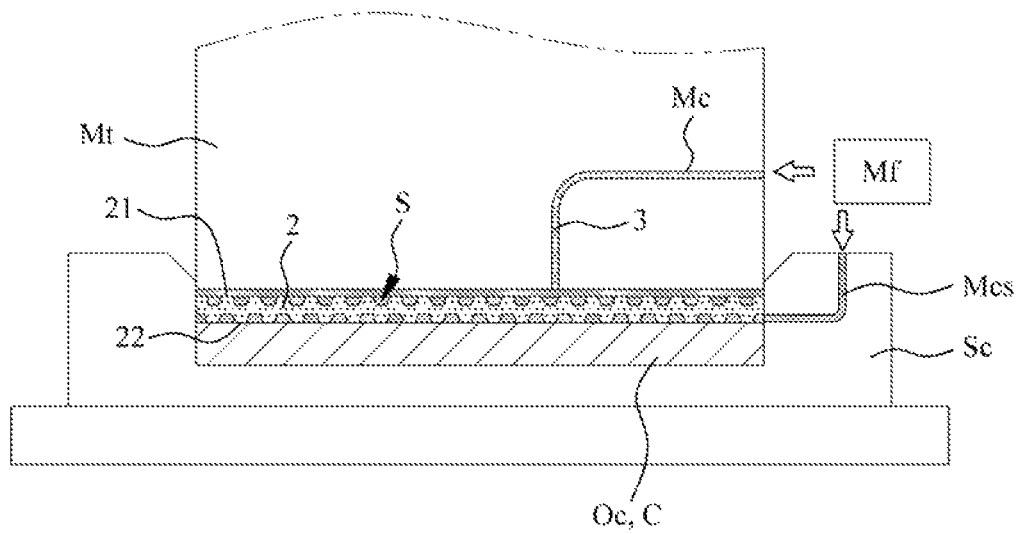
FIG. 3 illustrates a cross-sectional view of an electronic device testing apparatus with multiphase thermal interface component according to a second embodiment of the instant disclosure.

Please refer to FIG. 3. FIG. 3 illustrates a cross-sectional view of an electronic device testing apparatus with multiphase thermal interface component according to a second embodiment of the instant disclosure. In this embodiment, the thermal interface fluid material 3 is applied on the thermal interface solid element 2 through the fluid channel Mc. As shown in the figures, in this embodiment, the thermal control device Mt comprises a fluid channel Mc and a fluid supply module Mf. One of two ends of the fluid channel Mc is in communication with the fluid supply module Mf, and the other end of the fluid channel Mc is in communication with a lower surface of the thermal control device Mt: that is, in this embodiment, the other end of the fluid channel Mc is in communication with the contact surface between the thermal control device Mt and the multiphase thermal interface component T. The fluid supply module Mf is configured to supply the thermal interface fluid material 3 to the first thermal conductive surface 21 of the thermal interface solid element 2 through the fluid channel Mc.

Furthermore, in this embodiment, the socket Sc may comprise a fluid delivering channel Mcs. One of two ends of the fluid delivering channel Mcs is in communication with the fluid supply module Mf, and the other end of the fluid delivering channel Mcs is in communication with the second thermal conductive surface 22 of the thermal interface solid element 2: that is, in this embodiment, the other end of the fluid delivering channel Mcs is in communication with the contact surface between the second thermal conductive surface 22 and the electronic device under test C. Accordingly, the thermal interface fluid material 3 can be constantly retained on the first thermal conductive surface 21 and the second thermal conductive surface 22. Even if the thermal interface fluid material 3 evaporates due to heating or overflows, the fluid supply module Mf can promptly replenish the thermal interface fluid material 3. However, it is understood that, this embodiment is not limited to the dual-supply configuration (the fluid supply module Mf supplies the thermal interface fluid material 3 through both the fluid channel Mc and the fluid delivery channel Mcs): according to practical situations, in some embodiments, the fluid supply module Mf may be configured to supply the thermal interface fluid material 3 only through the fluid channel Mc or only through the fluid delivery channel Mcs. Moreover, the fluid channel Mc and the fluid delivery channel Mcs are not limited to be configured as hollow channels; in some embodiments, the fluid channel Mc and the fluid delivery channel Mcs may be made of capillary materials so that the fluid channel Mc and the fluid delivery channel Mcs can supply the thermal interface fluid material 3 through capillary action, and thus the thermal interface fluid material 3 can be applied on the first thermal conductive surface 21 and the second thermal conductive surface 22 of the thermal interface solid element 2.

Figure 4:
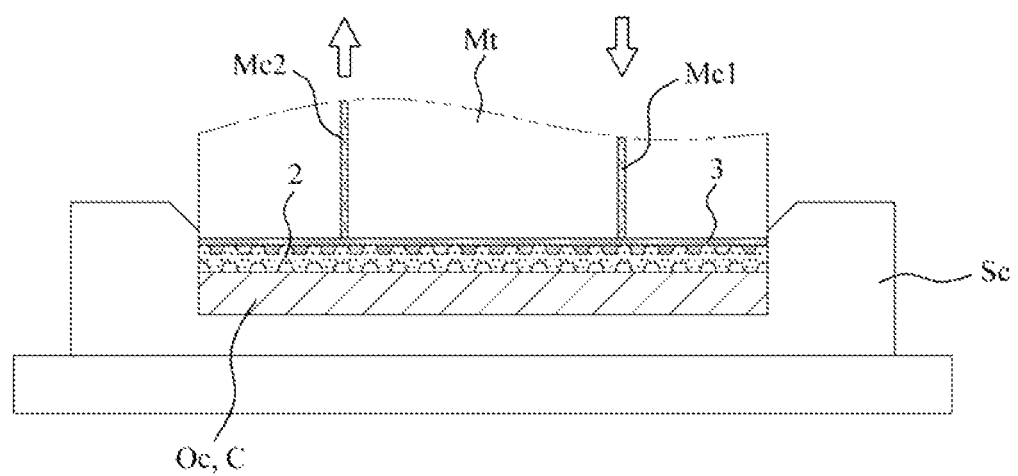
FIG. 4 illustrates a cross-sectional view of an electronic device testing apparatus with multiphase thermal interface component according to a third embodiment of the instant disclosure.

Please refer to FIG. 4. FIG. 4 illustrates a cross-sectional view of an electronic device testing apparatus with multiphase thermal interface component according to a third embodiment of the instant disclosure. The difference between the third embodiment and the second embodiment is at least that, in this embodiment, the thermal control device Mt comprises a fluid inlet channel Mc1 and a fluid outlet channel Mc2. The fluid inlet channel Mc1 is configured to supply the thermal interface fluid material 3 to the thermal interface solid element 2, and the fluid outlet channel Mc2 is configured to discharge the thermal interface fluid material 3 from the thermal interface solid element 2. Accordingly, in this embodiment, the thermal interface fluid material 3 can be replaced as need (for example, when the thermal interface fluid material 3 becomes overheated). Such configuration allows the thermal interface fluid material 3 to flow in a circulating manner so as to cool or heat the thermal interface solid element 2 timely, thereby achieving great thermal conduction performances.

Figure 5A:
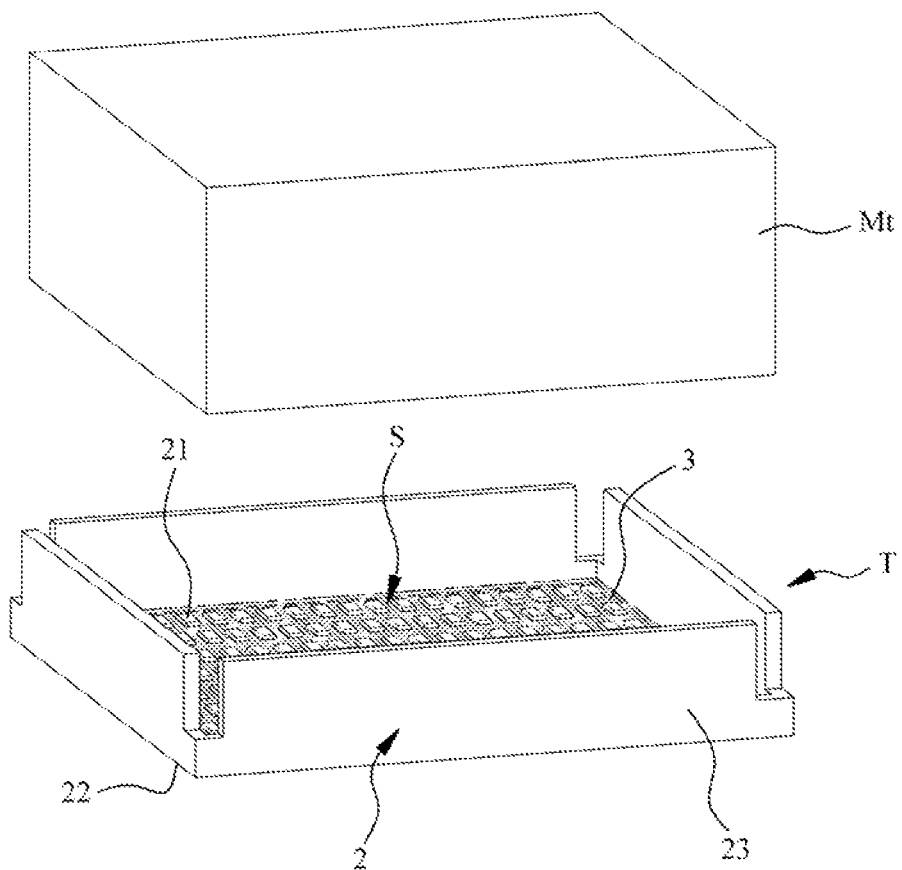
FIG. 5A illustrates a perspective view of an electronic device testing apparatus with multiphase thermal interface component according to a fourth embodiment of the instant disclosure.
Figure 5B:
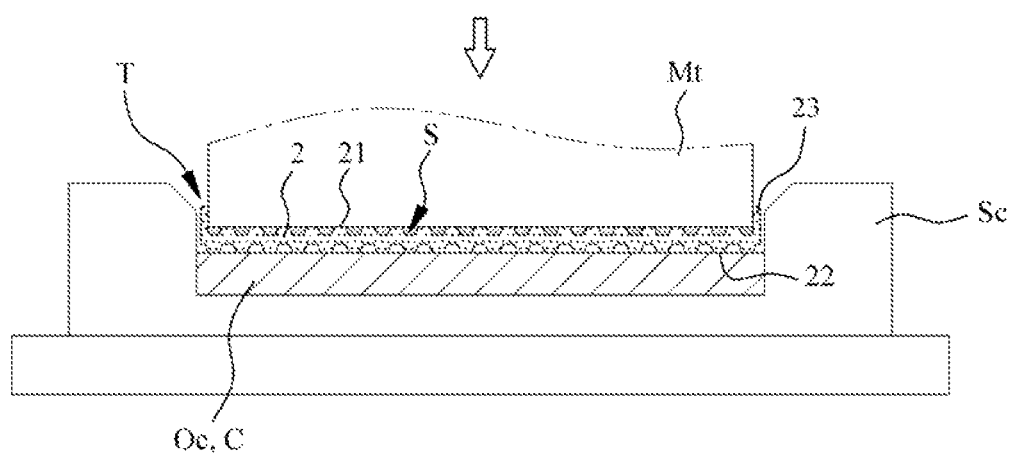
FIG. 5B illustrates a cross-sectional view of the electronic device testing apparatus with multiphase thermal interface component of the fourth embodiment of the instant disclosure.

Please refer to FIG. 5A and FIG. 5B. FIG. 5A illustrates a perspective view of an electronic device testing apparatus with multiphase thermal interface component according to a fourth embodiment of the instant disclosure, and FIG. 5B illustrates a cross-sectional view of the electronic device testing apparatus with multiphase thermal interface component of the fourth embodiment of the instant disclosure. In this embodiment, the thermal interface solid element 2 further comprises an outer peripheral frame 23 integrally extending from the first thermal conductive surface 21 to a direction away from the first thermal conductive surface 21. In other words, in this embodiment, the outer peripheral frame 23 protrudes upwards along the outer edge of the thermal interface solid element 2. Therefore, the thermal interface solid element 2 is formed as a container with an accommodation space S for accommodating the thermal interface fluid material 3. Accordingly, the multiphase thermal interface component T can be made.

Moreover, the thermal interface solid element 2, forming in the container, is directly fitted underneath the lower portion of the thermal control device Mt, and the thermal interface solid element 2 is closely mated with the thermal control device Mt through the outer peripheral frame 23, preventing the multiphase thermal interface component T from detaching off the thermal control device Mt. Therefore, in this embodiment, the multiphase thermal interface component T can be positioned easily and firmly, and the thermal interface fluid material 3 remains contained within the thermal interface solid element 2 without spilling.

Figure 6:
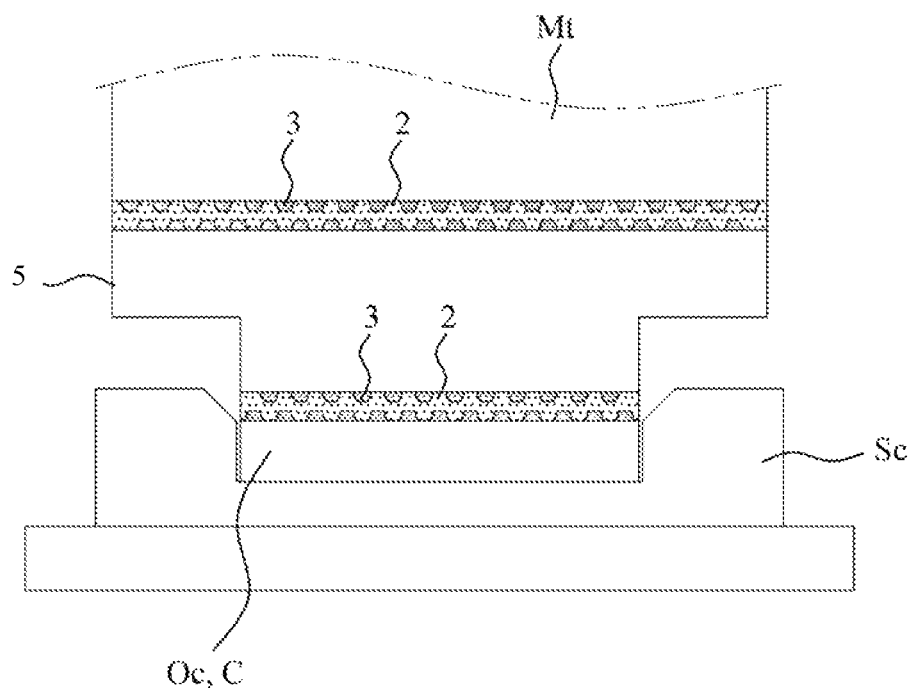
FIG. 6 illustrates a cross-sectional view of an electronic device testing apparatus with multiphase thermal interface component according to a fifth embodiment of the instant disclosure.

Please refer to FIG. 6. FIG. 6 illustrates a cross-sectional view of an electronic device testing apparatus with multiphase thermal interface component according to a fifth embodiment of the instant disclosure. The difference between the fifth embodiment and the foregoing embodiments lies in the configuration of the thermal control device Mt. Specifically, in order to allow the apparatus to be adapted to electronic devices under test C (temperature-controlled component Oc) with various specifications or dimensions, in this embodiment, the lower surface of the thermal control device Mt is provided with an adapter board 5, wherein the dimensions of the two end surfaces of the adapter board 5 respectively mate with the lower surface of the thermal control device Mt and the upper surface of the electronic device under test C. Therefore, the adapter board 5 can be served as a conversion of the contact area (the thermal conduction area). Moreover, a thermal interface solid element 2 is provided on each of the two end surfaces of the adapter board 5, and the two thermal conductive surfaces of each of the thermal interface solid elements 2 is filled with the thermal interface fluid material 3. Moreover, in this embodiment, the thermal control device Mt may comprise an evaporator and a heater so as to provide heating and cooling temperature control performances.

The above embodiments are merely examples for the purpose of illustration, and the scope claimed in the instant disclosure should be based on the claims, and is not limited to the above embodiments.

What is claimed is:

1. A method of forming a multiphase thermal interface component, wherein the method comprises following steps:
    providing a thermal interface solid element, wherein the thermal interface solid element has a first thermal conductive surface and a second thermal conductive surface, and at least one surface among the first thermal conductive surface and the second thermal conductive surface has at least one accommodation space: the first thermal conductive surface is configured to contact a thermal control device, and the second thermal conductive surface is configured to contact a temperature-controlled component; and
    applying a thermal interface fluid material to at least one among on the thermal interface solid element, between the thermal control device and the first thermal conductive surface, and between the second thermal conductive surface and the temperature-controlled component, and filling the thermal interface fluid material in the at least one accommodation space: the thermal interface fluid material under ambient temperature is in liquid, gas, or gel state, or a combination of any two or three thereof.

2. The method of forming the multiphase thermal interface component according to claim 1, wherein the thermal interface fluid material is applied between the second thermal conductive surface of the thermal interface solid element and the temperature-controlled component, and the thermal interface fluid material is filled into the at least one accommodation space of the second thermal conductive surface.

3. The method of forming the multiphase thermal interface component according to claim 1, wherein the thermal control device comprises a fluid supply module configured to apply the thermal interface fluid material to the first thermal conductive surface, and the thermal interface fluid material is filled into the at least one accommodation space of the first thermal conductive surface.

4. A multiphase thermal interface component, comprising:
    a thermal interface solid element having a first thermal conductive surface and a second thermal conductive surface, wherein at least one surface among the first thermal conductive surface and the second thermal conductive surface has at least one accommodation space; and
    a thermal interface fluid material filled into the at least one accommodation space of the at least one surface;
    wherein the thermal interface solid element under ambient temperature is in a solid state: the thermal interface fluid material under ambient temperature is in liquid, gas, or gel state, or a combination of any two or three thereof.

5. The multiphase thermal interface component according to claim 4, wherein the thermal interface solid element further comprises an outer peripheral frame integrally extending from the first thermal conductive surface to a direction away from the first thermal conductive surface.

6. The multiphase thermal interface component according to claim 4, wherein the thermal interface solid element further has at least one through hole defined through the first thermal conductive surface and the second thermal conductive surface.

7. An electronic device testing apparatus with multiphase thermal interface component, wherein the electronic device testing apparatus comprises:
    a thermal control device;
    a multiphase thermal interface component comprising a thermal interface solid element and a thermal interface fluid material, wherein the thermal interface solid element has a first thermal conductive surface and a second thermal conductive surface: at least one surface among the first thermal conductive surface and the second thermal conductive surface has at least one accommodation space; the thermal interface fluid material is filled into the at least one accommodation space of the at least one surface; and a socket configured to accommodate an electronic device under test;

wherein the first thermal conductive surface of the thermal interface solid element is configured to contact the thermal control device, and the second thermal conductive surface of the thermal interface solid element is configured to contact the electronic device under test on the socket.

8. The electronic device testing apparatus with multiphase thermal interface component according to claim 7, further comprising a fluid application device configured to apply the thermal interface fluid material to at least one among the electronic device under test, the thermal interface solid element, and the thermal control device.

9. The electronic device testing apparatus with multiphase thermal interface component according to claim 7, wherein the thermal control device comprises a fluid channel and a fluid supply module, one of two ends of the fluid channel is in communication with the fluid supply module, and the other end of the fluid channel is in communication with the multiphase thermal interface component; the fluid supply module is configured to supply the thermal interface fluid material to the thermal interface solid element through the fluid channel.

10. The electronic device testing apparatus with multiphase thermal interface component according to claim 7, wherein the thermal interface solid element further comprises an outer peripheral frame integrally extending from the first thermal conductive surface to a direction away from the first thermal conductive surface; the multiphase thermal interface component is fitted over the thermal control device through the outer peripheral frame, and the thermal interface fluid material is filled into the at least one accommodation space of the first thermal conductive surface.

* * * * *